US009461433B2

(12) United States Patent
Nozaki

(10) Patent No.: US 9,461,433 B2
(45) Date of Patent: Oct. 4, 2016

(54) LIGHT-EMITTING DEVICE

(71) Applicant: Stanley Electric Co., Ltd., Tokyo (JP)

(72) Inventor: Takahiko Nozaki, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 197 days.

(21) Appl. No.: 14/213,157

(22) Filed: Mar. 14, 2014

(65) Prior Publication Data

US 2014/0268787 A1    Sep. 18, 2014

(30) Foreign Application Priority Data

Mar. 15, 2013    (JP) ................. 2013-053239

(51) Int. Cl.

| G02B 27/20 | (2006.01) |
|---|---|
| H01S 3/00 | (2006.01) |
| H01S 5/00 | (2006.01) |
| H01S 5/022 | (2006.01) |
| H01S 5/024 | (2006.01) |
| H01S 3/04 | (2006.01) |
| G02B 6/42 | (2006.01) |

(52) U.S. Cl.
CPC ............ *H01S 3/005* (2013.01); *G02B 6/4204* (2013.01); *G02B 6/4269* (2013.01); *H01S 3/04* (2013.01); *H01S 5/005* (2013.01); *H01S 5/02288* (2013.01); *H01S 5/02296* (2013.01); *H01S 5/02469* (2013.01)

(58) Field of Classification Search
CPC ............ G02B 6/29361; G02B 6/2937; G02B 6/2928; G02B 6/4215; G02B 6/4226; G02B 6/4292; G02B 6/4207; G02B 6/4206; G02B 6/42; H01S 3/005; H01S 3/04; H01S 5/005; H01S 5/02288; H01S 5/02296; H01S 5/02469
USPC ........................................... 362/259
See application file for complete search history.

(56) References Cited

U.S. PATENT DOCUMENTS

| 5,111,476 A * | 5/1992 | Hollenbeck .......... G02B 6/4226 372/107 |
|---|---|---|
| 5,739,502 A * | 4/1998 | Anderson ............ B23K 26/389 148/565 |
| 2003/0210874 A1 | 11/2003 | Souda et al. |
| 2009/0003400 A1 * | 1/2009 | Nagahama ............ H01L 33/483 372/50.23 |

FOREIGN PATENT DOCUMENTS

| JP | 2010-165834 A | 7/2010 |
|---|---|---|
| WO | WO2012/154510 A2 | 11/2012 |

OTHER PUBLICATIONS

European Search Report for EP 14020031.2 (May 30, 2014).

* cited by examiner

*Primary Examiner* — Jason Moon Han
*Assistant Examiner* — Omar Rojas Cadima
(74) *Attorney, Agent, or Firm* — Kenealy Vaidya LLP

(57) ABSTRACT

A light-emitting device can have high heat dissipation performance from a light-transmitting member and be capable of easily making alignment of the light-transmitting member and an incidence hole for light into the light-transmitting member. The light-emitting device can include: a base; a light-emitting element held by the base; a lens held by the base and disposed above the light-emitting element, configured to condense light emitted from the light-emitting element; a first tubular member disposed on the base; a second tubular member fitted into the first tubular member; a holder allowed to be inserted into the second tubular member and thereby fitted into the second tubular member and having a through hole through which light condensed by the lens passes; and a light-transmitting member formed on the holder so as to block the through hole.

4 Claims, 6 Drawing Sheets

LIGHT-EMITTING DEVICE

This application claims the priority benefit under 35 U.S.C. §119 of Japanese Patent Application No. 2013-053239 filed on Mar. 15, 2013, which is hereby incorporated in its entirety by reference.

TECHNICAL FIELD

The presently disclosed subject matter relates to a light-emitting device.

BACKGROUND ART

In recent years, there are light-emitting devices, each employing a laser light source as a light source thereof. Among such light-emitting devices, there is, for example, a light-emitting device in which emitted light from a laser light source can be condensed by a lens and the condensed light can be made entered, as excitation light, into a wavelength conversion member containing a phosphor to mix part of the excitation light from the laser light source and fluorescence from the excited phosphor together in order to obtain light of a desired color. (See, for example, Japanese Patent Application Laid-Open No. 2010-165834.)

In a light-emitting device in which light from a light source is made entered into a wavelength conversion member containing a phosphor, heat is generated when the phosphor is excited by the excitation light. In the light-emitting device as disclosed in Japanese Patent Application Laid-Open No. 2010-165834, a support structure configured to support a light-transmitting member containing a wavelength conversion material is composed of a plurality of members. Therefore many interfaces among the members are present along a thermal path from the light-transmitting member to the outside of the light-emitting device. Thus, a thermal resistance in the path has become high. Therefore, heat dissipation performance from the light-transmitting member is lowered and a reduction in the excitation efficiency of the phosphor occurs due to a temperature increase of the light-transmitting member. Moreover, there is also a problem in that it is difficult to align the light-transmitting member with respect to the laser light source and to align an incidence hole for light into the light-transmitting member.

SUMMARY

The presently disclosed subject matter was devised in view of these and other problems and features in association with the conventional art. According to an aspect of the presently disclosed subject matter, there is provided a light-emitting device having high heat dissipation performance from a light-transmitting member and capable of easily making alignment of the light-transmitting member and an incidence hole for light into the light-transmitting member.

According to another aspect of the presently disclosed subject matter, a light-emitting device can include: a base; a light-emitting element held by the base; a lens held by the base and disposed above the light-emitting element, configured to condense light emitted from the light-emitting element; a first tubular member disposed on the base; a second tubular member fitted into the first tubular member; a holder allowed to be inserted into the second tubular member and thereby fitted into the second tubular member and having a through hole through which light condensed by the lens passes; and a light-transmitting member formed on the holder so as to block the through hole.

In the light-emitting device with the above configuration, the through hole can have a frustum shape such that as compared to one cross sectional shape closer to the light-emitting element (on a side of the light-emitting element), the other cross sectional shape opposite to the one cross sectional shape is smaller.

In the light-emitting device with the above configuration, the second tubular member can have a heat-dissipation part formed on an outer side surface thereof, and the holder can have an outer side surface that is in contact with an inner side surface of the second tubular member that correspond to the outer side surface where the heat-dissipation part is formed.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to light-emitting devices of the presently disclosed subject matter with reference to the accompanying drawings in accordance with exemplary embodiments.

First Exemplary Embodiment

Figure 1A:
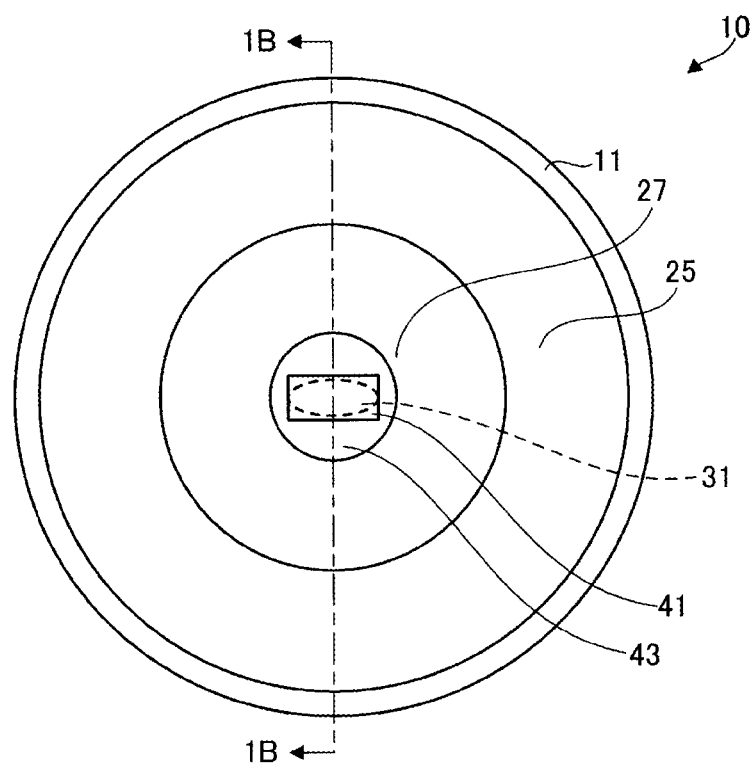
FIG. 1A is a top view of a light-emitting device of a first exemplary embodiment made in accordance with principles of the presently disclose subject matter.
Figure 1B:
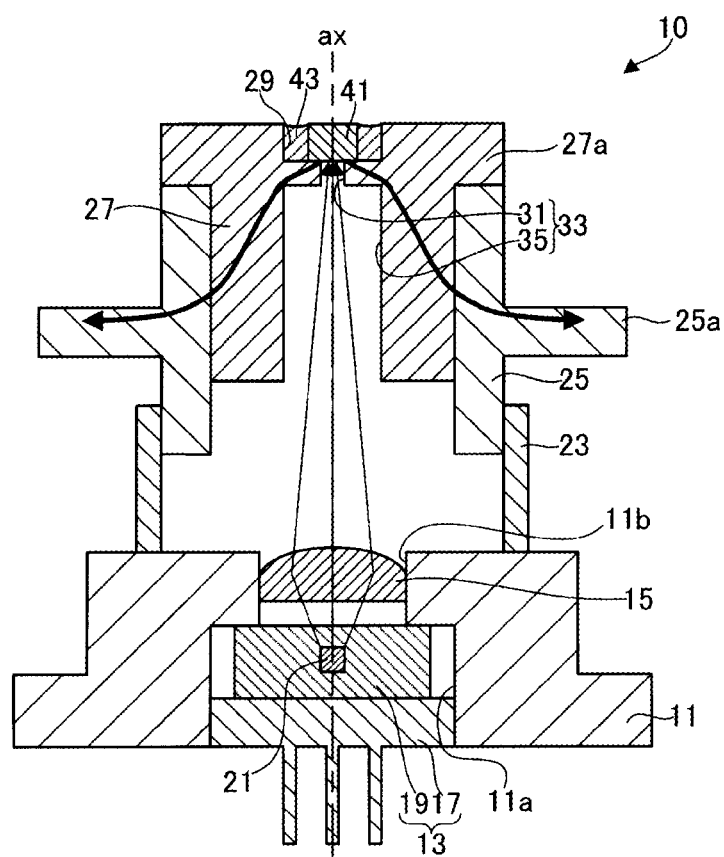
FIG. 1B is a cross-sectional view of the light-transmitting device taken along line 1B-1B in FIG. 1A.

A light-emitting device 10 according to the first exemplary embodiment made in accordance with the principles of the presently disclosed subject matter will be described below with reference to FIGS. 1A and 1B. FIG. 1A is a top view of the light-emitting device 10. FIG. 1B is a cross-sectional view of the light-emitting device 10 taken along line 1B-1B in FIG. 1A. In FIG. 1B, a path of light emitting from a later-described light-emitting element in the light-emitting device 10 and entering a later-described light-transmitting member is indicated by a solid arrow (thinner line). An optical axis of the emitted light from the light-emitting element is indicated by "ax." A heat dissipation path for heat generated in the later-described light-transmitting member is indicated by a solid arrow (thicker line).

A base 11 can have a cylindrical hollow tubular shape, and include: a first inner wall portion 11a configured to support a stem 13; and a second inner wall portion 11b disposed in a region above the first inner wall portion 11a, configured to support a lens 15.

The stem 13 can be fixed to the inner wall portion 11a of the base 11, for example, by means of welding or adhesive bonding. The stem 13 can be composed of a disk-shaped stem bottom 17 and a columnar stem cylinder 19 protruding from an upper surface of the stem bottom 17. A light-emitting element 21 can be a laser diode (LD) element which can emit laser light with a wavelength of 380 to 473 nm, preferably 445 nm, for example. The light-emitting element 21 can be disposed on the side surface of the stem cylinder 19 so as to emit light upwardly. The lens 15 can be disposed above the stem cylinder 19, i.e., in the light-emitting direction. The lens 15 can be fixed to the second inner wall portion 11b. The lens 15 can be, for example, a convex lens to converge the laser light emitted from the light-emitting element 21.

A first tubular member 23 can be disposed above the lens 15 and can be a cylindrical member having a circular columnar hollow portion through which the laser light converged by the lens 15 can pass. The first tubular member 23 can be fixed to an upper surface of the base 11, for example, by means of welding or adhesive bonding.

A second tubular member 25 can be a cylindrical member having a circular columnar hollow portion through which the laser light converged by the lens 15 can pass. The second tubular member 25 can include an annular heat-dissipating protrusion 25a protruded from an outer side surface thereof. The second tubular member 25 can be joined with the first tubular member 23 at a lower portion thereof in such a manner that an inner side surface of the first tubular member 23 can be in contact with the outer side surface of the second tubular member 25 to achieve fitting therebetween. The second tubular member 25 can be fixed to the first tubular member, for example, by means of welding or adhesive bonding. When the light-emitting device 10 is equipped in other structure, the heat-dissipating protrusion 25a can serve as a heat-dissipating part to be made in contact with a member (not shown) forming a heat dissipation path of the structure such as a heat-dissipating jig attached to the structure.

The base 11, the first tubular member 23, and the second tubular member 25 can be made of a material with excellent thermal conductance, such as nickel, cobalt, iron, brass, stainless steel, a nickel-iron alloy, an iron-nickel-cobalt alloy, aluminum, copper, or carbon, for example.

A holder 27 can be a cylindrical member having a recess 29 in an upper surface thereof. An incidence hole 31 with an elliptic column shape, through which the laser light converged by the lens 15 can pass, can be formed at the center of a bottom surface of the recess 29. A light-guiding hole 35, which can form a through hole 33 together with the incidence hole 31, can be formed below the incidence hole 31. In other words, the holder 27 can be a hollow cylindrical structure made of a single member. The holder 27 can be joined with the second tubular member 25 so as to achieve fitting therebetween in such a manner that an outer side surface of the holder 27 can be in contact with an inner side surface of the second tubular member 25. The holder 27 can include a flange 27a in an upper portion of the outer side surface thereof. The flange 27a can serve as a stopper when performing the insertion fitting of the holder 27 into the second tubular member 25. Note that the holder 27 can be integrally molded with a material having excellent thermal conductance, such as nickel, cobalt, iron, brass, stainless steel, a nickel-iron alloy, an iron-nickel-cobalt alloy, aluminum, copper, or carbon, for example. When the base 11, the first tubular member 23, the second tubular member 25, and the holder 27 are connected together by means of welding, it is preferable that these parts be formed with the same material.

A light-transmitting member 41 can be disposed at a central portion of the bottom surface of the recess 29 so as to block the incidence hole 31 and can be a member with a rectangular column shape, i.e., cuboid, having a rectangular bottom surface. The light-transmitting member 41 can be made of, for example, a light-transmitting material such as a glass, an aluminum oxide, a silicone resin, or an epoxy resin containing, as a wavelength conversion material, yellow phosphor particles of a YAG:Ce phosphor obtained by introducing Ce (cerium) as an activator into YAG (Yttrium Aluminum Garnet: $Y_3Al_5O_{12}$), or the like. For fixing the light-transmitting member 41 to the bottom surface of the recess 29, a transparent adhesive such as a silicone resin adhesive or a glass adhesive, for example, can be used.

The yellow phosphor can absorb laser light emitted from the light-emitting element 21, e.g., blue excitation light with a wavelength of about 460 nm and then emits yellow light having an emission peak wavelength of about 560 nm. Thus, white light can be obtained as a result of mixing blue light, which has been emitted from the light-emitting element 21 and has not been absorbed by the phosphor, and the yellow light emitted from the excited phosphor together. Note that a phosphor which can emit other color may be used, if desired, without being limited to the yellow phosphor such as the above-described YAG:Ce. For example, white light can be obtained by including a mixture of a red phosphor and a green phosphor in the light-transmitting member 41 and making these phosphors excited by blue laser light to mix the laser light and the fluorescence together. When a laser element which can emit near-ultraviolet light with a wavelength of about 380 to 400 nm is used as the light-emitting element 21, white light can be obtained by including a mixture of three kinds of phosphors which emit blue fluorescence, green fluorescence, and red fluorescence, respectively, when receiving light of this wavelength in the light-transmitting member 41 and making these phosphors excited by the laser light. Furthermore, without being limited to the white light, light emission of a color other than white, e.g., amber or red, can be obtained depending on a selection of phosphors to be used as appropriate.

A reflective member 43 can be formed in the recess 29 so as to cover a side surface of the light-transmitting member 41. The reflective member 43 can be made of a silicone resin, an epoxy resin, or the like containing light-scattering particles of silica, alumina, titania, or the like. When the reflective member 43 is formed with a resin material such as a silicone resin, the reflective member 43 may be formed by: potting a resin material for forming the reflective member 43, which contains light-scattering particles, between an inner side surface of the recess 29 and the side surface of the light-transmitting member 41 after the light-transmitting member 41 is disposed in the recess 29; and thermally curing the resin material. Note that it is preferable that a refractive index of a material forming the reflective member 43 be lower than a refractive index of a material forming the light-transmitting member 41 in order to make light, traveling from the light-transmitting member 41 toward the reflective member 43, totally reflected at an interface between the light-transmitting member 41 and the reflective member 43 and thereby avoid the light leaking into the reflective member 43 as much as possible.

In the light-emitting device 10, heat may be generated when the laser light emitted from the light-emitting element 21 and converged by the lens excites the phosphor in the light-transmitting member 41. This heat is generated more especially in a lower part of the light-transmitting member 41, i.e., in the vicinity of a surface (lower surface) through which the laser light is entered. The light-emitting device 10 can have the structure in which the holder 27 for holding the light-transmitting member 41 is fitted into the inner side of the second tubular member 25. As a result, a heat transfer structure serving also as a fixation (fitting) structure capable of being a heat transfer path can be provided in a large area below the light-transmitting member 41. By shortening the heat transfer path (the thick arrow in the figure) from the lower surface of the light-transmitting member 41, which is a major heat generation source, to the heat-dissipating protrusion 25a, which is a heat-dissipating part, a thermal resistance in the heat dissipation path can be reduced. A thermal resistance in the heat dissipation path can be reduced also by forming the holder 27 for holding the light-transmitting member 41 with a single member and thereby reducing the number of interfaces among members present along the heat dissipation path. As just described, the heat dissipation performance from the light-transmitting member 41 can be made excellent in the light-emitting device 10. Thus, a temperature of the light-transmitting member 41 can be kept low and a reduction in the excitation efficiency of the phosphor due to a temperature increase can be prevented.

In order to secure the heat transfer path from the light-transmitting member 41, which is a heat-generating part, to the heat-dissipating protrusion 25a, which is a heat-dissipating part, it is preferable that the holder 27 extend up to a region where the heat-dissipating protrusion 25a of the second tubular member 25 is formed and the outer side surface of the holder 27 be in contact with the inner side surface of the region where the heat-dissipating protrusion 25a of the second tubular member is formed.

Figure 2A:
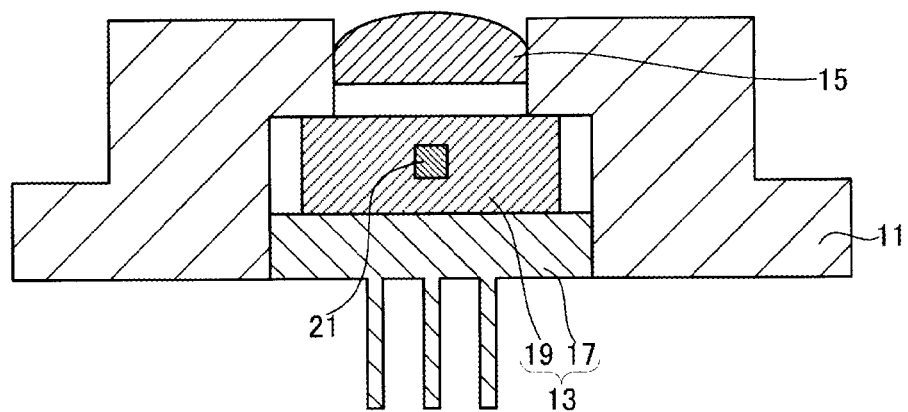
FIG. 2A is a cross-sectional view illustrating an assembly step of the light-emitting device of the first exemplary embodiment.
Figure 2B:
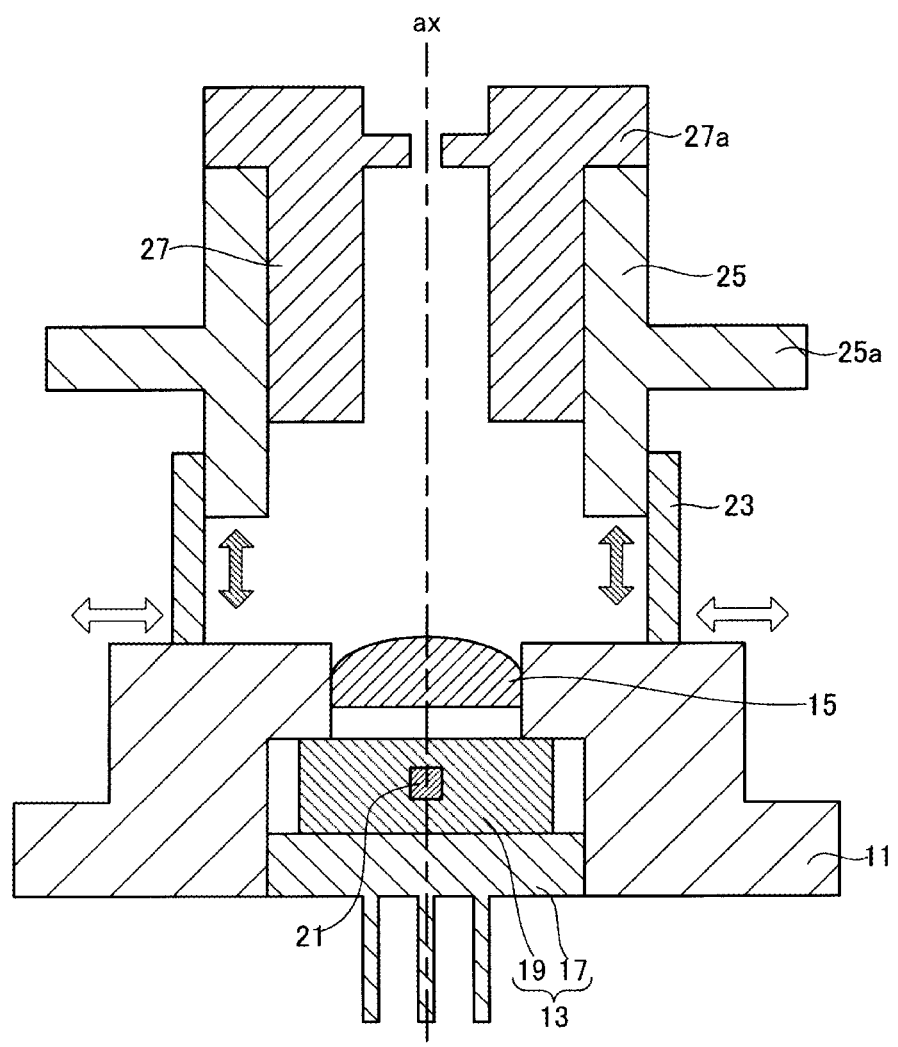
FIG. 2B is a cross-sectional view illustrating assembly steps of the light-emitting device of the first exemplary embodiment.

An assembly of the light-emitting device 10 will now be described with reference to FIGS. 2A and 2B. When assembling the light-emitting device 10, first, the stem 13 equipped with the light-emitting element 21 can be fixed to the base 11 having the lens 15 attached thereto by means of welding or the like (FIG. 2A).

Next, the first tubular member 23 can be placed on the upper surface of the base 11 and the second tubular member 25 can be inserted and fitted into the first tubular member 23. The holder 27 can then be inserted and fitted into the second tubular member 25. At this point, the first tubular member 23 is not being fixed to the base 11 and movable in an in-plane direction (direction of an outline arrow in the figure) orthogonal to the optical axis ax. The second tubular member is not being fixed to the first tubular member 23. The second tubular member is movable in a direction along the optical axis ax (direction of a shaded arrow in the figure) and rotatable around the optical axis ax. Also, the holder 27 is rotatable around the optical axis ax (FIG. 2B).

Thereafter, while the light-emitting element 21 is turned on, the first tubular member 23 and the second tubular member 25 can be moved to make alignment in such a manner that a condensing point of light emitted from the light-emitting element 21 and condensed by the lens 15 coincides with the center of the upper surface of the incidence hole 31, i.e., the center of the bottom surface of the recess 29. After the alignment, while maintaining the aligned positional relationship, the base 11 and the first tubular member 23 can be fixed together by means of welding or the like and the first tubular member 23 and the second tubular member 25 can be fixed together by means of welding or the like.

Thereafter, the holder 27 is once removed from the second tubular member 25, and the light-transmitting member 41 can be fixed at the center of the bottom surface of the recess 29 so as to block the incidence hole 31. For fixing the light-transmitting member 41, a transparent adhesive such as a silicone resin adhesive may be used. Then, a resin material for forming the reflective member 43, which contains light-scattering particles, can be potted between the inner side surface of the recess 29 and the side surface of the light-transmitting member 41 and thermally cured.

Next, a silicone adhesive or the like containing a filler with high thermal conductance such as a silver filler, for example, can be applied to a region of the surface of the holder 27 to be in contact with the second tubular member 25 when fitting is performed. Then, the holder 27 can be inserted and fitted into the second tubular member 25. The holder 27 and the second tubular member 25 can be fixed together, for example, by thermally curing the applied adhesive.

Finally, a lower surface of the flange 27a of the holder 27 and an upper surface of the second tubular member 25 can be welded together, for example, to complete the light-emitting device 10.

As described above, in the light-emitting device 10, the holder 27 is not screwed with, but is fitted into, the second tubular member 25. Therefore, the relative position between the holder 27 and the second tubular member 25, i.e., the relative position between the holder 27 and the light-emitting element 21 and the lens 15, when the light-emitting device 10 is completed, can be made coincide with the above-described aligned relative position with extremely high accuracy. Also, since the holder 27 is not screwed with, but fitted into, the second tubular member 25, rotational positions of the holder 27 and therefore the incidence hole 31 and the light-transmitting member 41 with respect to the optical axis ax can be very easily adjusted when precise orientation of the incidence hole 31 and/or the light-transmitting member 41 is required especially when the incidence hole 31 and/or the light-transmitting member 41 has a shape other than a circle in a top view as seen from above along the optical axis ax.

As described above, the light-emitting device 10 can have the structure in which the holder 27 for holding the light-transmitting member 41 is fitted into the inner side of the second tubular member 25 and an area where the member capable of serving as a heat transfer path is present is thereby increased below the light-transmitting member 41. As a result, the heat transfer path from the lower surface of the light-transmitting member 41, which is a major heat generation source, to the heat-dissipating protrusion 25a can be shortened. A thermal resistance in the heat dissipation path can be thereby reduced. Moreover, a thermal resistance in the heat dissipation path can be reduced also by forming the holder 27 for holding the light-transmitting member 41 with a single member and thereby reducing the number of interfaces among members present along the heat dissipation path. Therefore, a reduction in the excitation efficiency of the phosphor due to a temperature increase of the light-transmitting member 41 can be prevented.

Second Exemplary Embodiment

Figure 3:
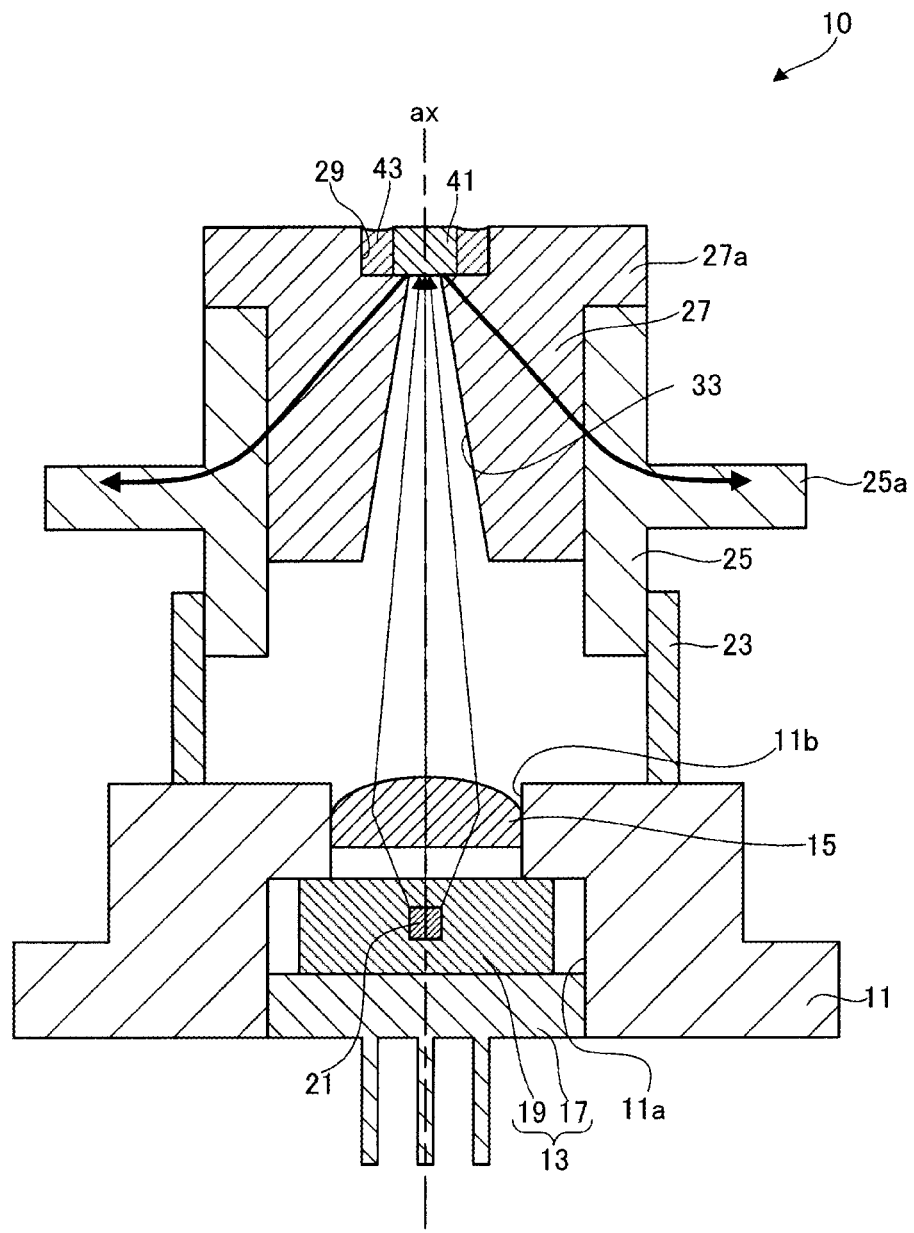
FIG. 3 is a cross-sectional view of a light-emitting device of a second exemplary embodiment made in accordance with the principles of the presently disclose subject matter.

The light-emitting device 10 according to the second exemplary embodiment of the presently disclosed subject matter will be described below with reference to FIG. 3. The light-emitting device 10 of the second exemplary embodiment has the same configuration as that of the light-emitting device 10 of the first exemplary embodiment except that the holder 27 has a different shape. FIG. 3 is a cross-sectional view of the light-emitting device 10 of the second exemplary embodiment made in accordance with the principles of the presently disclosed subject matter. In FIG. 3, as with FIG. 1B, a path of light emitting from the light-emitting element in the light-emitting device 10 and entering the light-transmitting member is indicated by a solid arrow (thinner line), and an optical axis of the emitted light from the light-emitting element is indicated by "ax." A heat dissipation path for heat generated in the light-transmitting member is indicated by a solid arrow (thicker line).

As illustrated in FIG. 3, in the light-emitting device 10 of the second exemplary embodiment, the light-guiding hole 35 of the through hole 33 can have a shape continuous with the incidence hole 31. In the light-emitting device 10 of the second exemplary embodiment, the through hole 33 can have a circular truncated cone or elliptic truncated cone shape gradually narrowing in an upward direction up to the lower surface of the light-transmitting member 41 so as not to block a path of laser light emitted from the light-emitting element 21, condensed at the lens 15, and entered into the light-transmitting member 41. In other words, the through hole 33 can have a frustum shape in which as compared to one cross sectional shape on the light-emitting element 21 side, the other cross sectional shape opposite to the one cross sectional shape, i.e., the cross sectional shape in contact with the lower surface of the light-transmitting member 41, is smaller. With such a configuration, while maintaining an incidence path of the condensed laser light into the light-transmitting member 41, an even greater heat dissipation path from the light-transmitting member 41 can be secured. Also, a heat transfer path from the lower surface of the light-transmitting member 41, which is a major heat generation source, to the heat-dissipating protrusion 25a can be further shortened. Thus, a thermal resistance in the heat dissipation path can be reduced.

In the above-described exemplary embodiments, the member containing a wavelength conversion material can be used as the light-transmitting member 41. However, in addition to the wavelength conversion material, the light-transmitting member 41 may contain a light-scattering material such as light-scattering particles of, for example, silica, alumina, titania, or the like. If there is no need to change the light color of laser light emitted from the light-emitting element 21, the light-transmitting member 41 may be a member containing only a light-scattering material without containing a wavelength conversion material.

Figure 4:
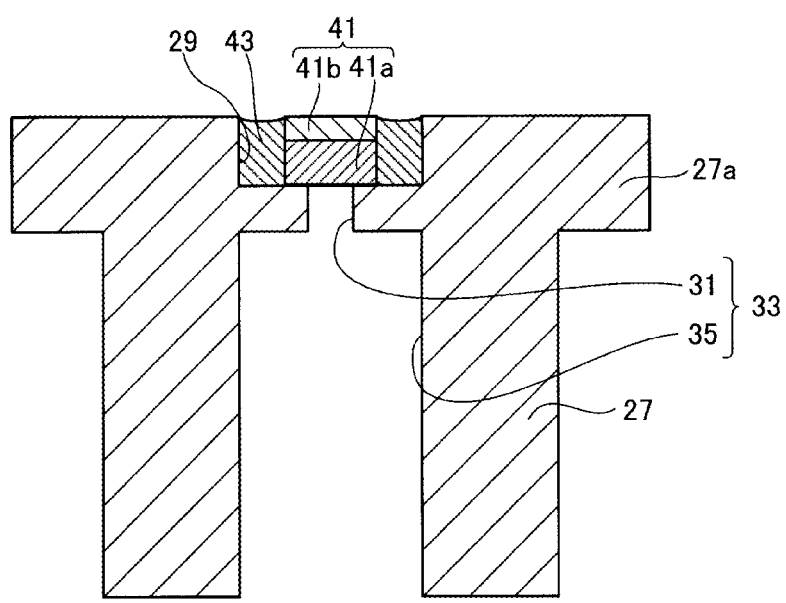
FIG. 4 is a cross-sectional view of a portion of a light-emitting device of another exemplary embodiment.

As illustrated in FIG. 4, which is a cross-sectional view of the holder 27, the light-transmitting member 41, and the reflective member 43, a light-scattering region 41a may be provided in a lower part of the light-transmitting member 41 and a wavelength conversion region 41b may be provided in an upper part of the light-transmitting member. In this case, the light-scattering region 41a may be made of, for example, a light-transmitting material containing light-scattering particles of silica, alumina, titania, or the like; and a light-transmitting ceramic material (glass, quartz, alumina, or the like), or a silicone resin or an epoxy resin. The wavelength conversion region 41b may be made of a light-transmitting material such as a glass, an aluminum oxide, a silicone resin, or an epoxy resin containing, as a wavelength conversion material, yellow phosphor particles of a YAG:Ce phosphor obtained by introducing Ce (cerium) as an activator into YAG (Yttrium Aluminum Garnet: $Y_3Al_5O_{12}$), or the like. While the light-scattering region 41a has been described as a region containing light-scattering particles, the light-scattering region 41a may be formed by roughening a surface of a light-transmitting material such as a ceramic, a light-transmitting resin, or a glass.

In the above-described exemplary embodiments, the light-transmitting member 41 can have a rectangular column shape. However, the light-transmitting member 41 may have any other shape to change the shape of the light-emitting surface in accordance with the shape of irradiated light of the light-emitting device. When a circular light-emitting surface is to be formed, for example, the light-transmitting member 41 may have a circular column shape or a circular truncated cone shape. When an elliptic light-emitting surface is to be formed, the light-transmitting member 41 may have an elliptic column shape or an elliptic truncated cone shape. When a polygonal light-emitting surface is to be formed, the light-transmitting member 41 may have a polygonal column shape or a polygonal truncated cone shape.

In the above-described exemplary embodiments, the incidence hole 31 can have an elliptic column shape or a circular truncated cone shape and the light-guiding hole 35 can have a circular column shape or a circular truncated cone shape. However, depending on a type of the light-emitting element used, a usage of the light-emitting device, and the like, shapes of the incidence hole 31 and the light-guiding hole 35 can take various shapes such as an elliptic truncated cone shape, a polygonal column shape, and a polygonal truncated cone shape in addition to the above-described circular column shape, elliptic column shape, and circular truncated cone shape.

The above-described exemplary embodiments illustrate cases such as obtaining white light by using the blue light-emitting element and the yellow phosphor. However, an emission color of the light-emitting element and a fluorescent color of the phosphor can be freely selected depending on a desired color of emitted light, a usage thereof, and the like.

While the reflective member 43 can be provided so as to cover the side surface of the light-transmitting member 41 in the above-described exemplary embodiments, the reflective member 43 may not be formed.

The above-described exemplary embodiments are described taking, as an example, a case where an LD element is used as the light-emitting element. However, other light-emitting element such as an LED element may be used.

The various numerical values, sizes, materials, and the like in the above-described exemplary embodiments are merely examples and can be appropriately selected depending on a usage, a light-emitting element used, and the like.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light-emitting device comprising:
   a base;
   a light-emitting element held by the base;
   a lens held by the base and disposed above the light-emitting element, configured to condense light emitted from the light-emitting element;
   a first tubular member disposed on the base;

a second tubular member fitted into the first tubular member;

a holder allowed to be inserted into the second tubular member and thereby fitted into the second tubular member and having a through hole through which light condensed by the lens passes; and a light-transmitting member formed on the holder so as to block the through hole, the light-transmitting member having a rectangular bottom surface with a size larger than the through hole, wherein the second tubular member has a heat-dissipation part formed on and protruded from an outer side surface thereof, the holder has a structure made of a single member composed of an upper flange portion and a lower insertion fitting portion, the upper flange portion has a lower surface disposed on an upper surface of the second tubular member, and the lower insertion fitting portion of the holder extends up to at least a region where the heat dissipation part of the second tubular member is formed and has an outer side surface that is in contact with an inner side surface of the second tubular member.

2. The light-emitting device according to claim 1, wherein the through hole has a frustum shape such that as compared to one cross sectional shape closer to the light-emitting element, the other cross sectional shape opposite to the one cross sectional shape is smaller.

3. The light-emitting device according to claim 1, wherein the heat dissipation part has an annular shape protruded from the outer side surface of the second tubular member.

4. The light-emitting device according to claim 2, wherein the heat dissipation part has an annular shape protruded from the outer side surface of the second tubular member.

\* \* \* \* \*